(12) United States Patent
Kang et al.

(10) Patent No.: US 11,283,235 B2
(45) Date of Patent: Mar. 22, 2022

(54) SEMICONDUCTOR LASER DEVICE

(71) Applicant: SAMSUNG ELECTRONICS CO., LTD., Suwon-si (KR)

(72) Inventors: Pil-Kyu Kang, Hwaseong-si (KR); Seok-Ho Kim, Hwaseong-si (KR); Tae-Yeong Kim, Yongin-si (KR); Hoe-Chul Kim, Seoul (KR); Hoon-Joo Na, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 210 days.

(21) Appl. No.: 16/538,044

(22) Filed: Aug. 12, 2019

(65) Prior Publication Data
US 2020/0136341 A1 Apr. 30, 2020

(30) Foreign Application Priority Data
Oct. 24, 2018 (KR) .................. 10-2018-0127246

(51) Int. Cl.
| H01S 5/0236 | (2021.01) |
| H01S 5/02 | (2006.01) |
| H01S 5/323 | (2006.01) |
| H01S 5/02251 | (2021.01) |

(52) U.S. Cl.
CPC .......... *H01S 5/0236* (2021.01); *H01S 5/0217* (2013.01); *H01S 5/02251* (2021.01); *H01S 5/323* (2013.01)

(58) Field of Classification Search
CPC .. H01S 5/0236; H01S 5/02251; H01S 5/0217; H01S 5/323; H01S 5/1032; H01S 5/021; H01S 5/0215; H01S 5/0216
See application file for complete search history.

(56) References Cited

U.S. PATENT DOCUMENTS

| 6,353,264 | B1 | 3/2002 | Coronel et al. |
| 6,815,828 | B1 | 11/2004 | Coronel et al. |
| 7,465,592 | B2 | 12/2008 | Yoo |
| 7,829,440 | B2 | 11/2010 | Chu et al. |
| 8,288,290 | B2 | 10/2012 | Carothers |
| 8,994,004 | B2 | 3/2015 | Bowers |
| 9,362,715 | B2 | 6/2016 | Sztein et al. |
| 2003/0068114 | A1 | 4/2003 | Link et al. |
| 2009/0116523 | A1* | 5/2009 | Leem ............. G02B 6/12004 372/44.01 |
| 2012/0300796 | A1 | 11/2012 | Sysak et al. |
| 2014/0307997 | A1 | 10/2014 | Bar et al. |
| 2016/0094014 | A1* | 3/2016 | Shin .................. G02B 6/12 372/45.01 |
| 2017/0207600 | A1 | 7/2017 | Klamkin et al. |

* cited by examiner

Primary Examiner — Xinning (Tom) Niu
(74) Attorney, Agent, or Firm — Lee IP Law, PC

(57) ABSTRACT

A semiconductor laser device may include a first cladding on a substrate, an optical waveguide on the first cladding, a laser light source chip on the optical waveguide to generate a laser beam, a first adhesive layer between the optical waveguide and the laser light source chip, and a second adhesive layer covering a sidewall of the laser light source chip.

20 Claims, 4 Drawing Sheets

SEMICONDUCTOR LASER DEVICE

CROSS-REFERENCE TO RELATED APPLICATION

Korean Patent Application No. 10-2018-0127246, filed on Oct. 24, 2018 in the Korean Intellectual Property Office (KIPO), and entitled: "Semiconductor Laser Device," is incorporated by reference herein in its entirety.

BACKGROUND

1. Field

Example embodiments relate to a semiconductor laser device.

2. Description of the Related Art

A semiconductor laser device may be fabricated by bonding a first substrate on which an optical waveguide and an epitaxial pattern may be formed and a second substrate on which a laser light source chip may be formed to each other. The optical waveguide and the epitaxial pattern may not be bonded well to the laser light source chip due to a void therebetween. Also, when separating the second substrate from the first substrate, the laser light source chip may be damaged.

SUMMARY

According to example embodiments, there is provided a semiconductor laser device. The semiconductor laser device may include a first cladding on a substrate, an optical waveguide on the first cladding, a laser light source chip formed on the optical waveguide to generate a laser beam, a first adhesive layer between the optical waveguide and the laser light source chip, and a second adhesive layer covering a sidewall of the laser light source chip.

According to example embodiments, there is provided a semiconductor laser device. The semiconductor laser device may include a laser light source chip, an optical waveguide formed under the laser light source chip to guide a laser beam generated by the laser light source chip, a substrate on which the optical waveguide is formed, an epitaxial pattern on the substrate, and an adhesive layer structure formed between the laser light source chip and the epitaxial pattern to cover a sidewall of the laser light source chip.

According to example embodiments, there is provided a semiconductor laser device. The semiconductor laser device may include a first cladding on a substrate, an optical waveguide on the first cladding, an epitaxial pattern including the same material as the optical waveguide on the substrate, a second cladding being formed between the optical waveguide and the epitaxial pattern on the first cladding, a first adhesive layer covering upper surfaces of the epitaxial pattern, the optical waveguide and the second cladding, a second adhesive layer including a horizontal portion extending in a horizontal direction substantially parallel to an upper surface of the substrate on the first adhesive layer and a vertical portion extending from the horizontal portion in a vertical direction substantially perpendicular to the upper surface of the substrate from the horizontal portion, and a laser light source chip of which a lower surface and a sidewall are covered by the second adhesive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
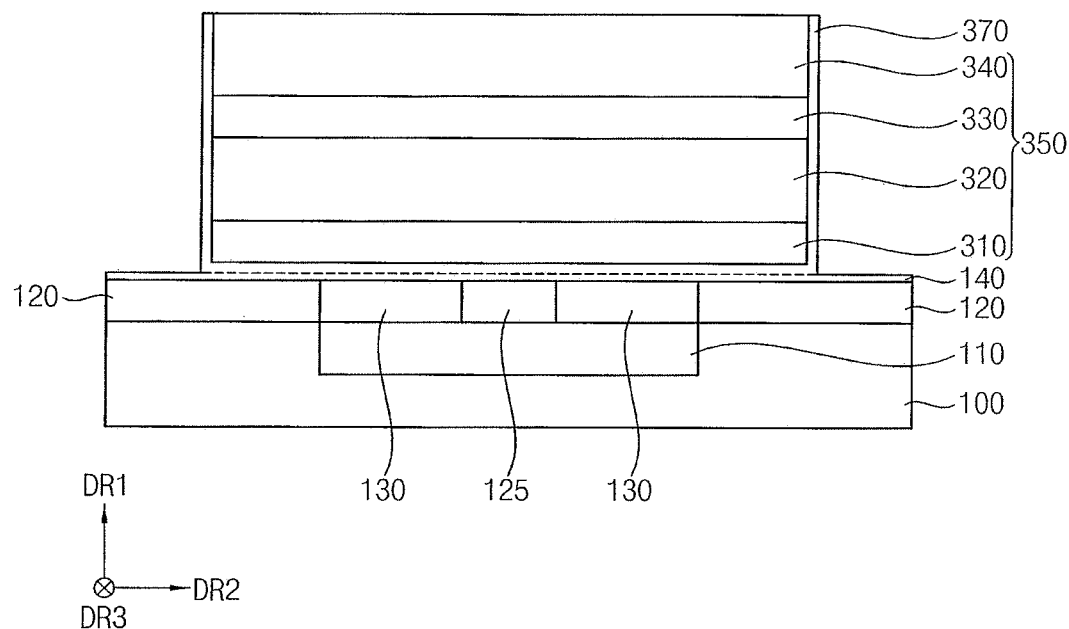
FIG. 1 illustrates a cross-sectional view of a semiconductor laser device in accordance with example embodiments.

FIG. 1 is a cross-sectional view illustrating a semiconductor laser device in accordance with example embodiments. Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. In example embodiments, the second and third directions may be orthogonal to each other.

Referring to FIG. 1, the semiconductor laser device may include a first cladding 110, an optical waveguide 125 and a laser light source chip 350 sequentially stacked on a first substrate 100 along the first direction DR1, and first and third adhesive layers 140 and 370 between the laser light source chip 350 and the optical waveguide 125.

The semiconductor laser device may further include a second cladding 130 covering both sidewalls of the optical waveguide 125, and an epitaxial pattern 120 on the first substrate 100. An upper surface of the epitaxial pattern 120, an upper surface of the optical waveguide 125, and an upper surface of the second cladding 120 may be coplanar, e.g., along the second direction DR2. Sides of the first substrate 100 and the second cladding 120 may be coplanar, e.g., along the third direction DR3. Sides of the second cladding 130 and sides of the first cladding 110 may be coplanar, e.g., along the third direction DR3.

The first substrate 100 may be a semiconductor substrate including, e.g., silicon (Si), germanium (Ge), etc. In one embodiment, the first substrate 100 may be a single crystalline silicon substrate. The first substrate 100 may be doped, e.g., with p-type or n-type impurities.

The first cladding 110 may be formed in an upper portion of the first substrate 100. The first cladding 110 may include a material having a refractive index lower than silicon (Si), e.g., silicon oxide ($SiO_2$), silicon nitride (SiN), and the like. An upper surface of the substrate 100 and an upper surface of the first cladding 110 may be coplanar.

The epitaxial pattern 120 may be on the first substrate 100 and the optical waveguide 125 may be on the first cladding 110. Each of the epitaxial pattern 120 and the optical waveguide 125 may extend in the third direction DR3.

As will be described later, the epitaxial pattern 120 and the optical waveguide 125 may be formed by a solid phase epitaxy (SPE) process using the upper surface of the first substrate 100 as a seed and, thus, may include substantially the same material as the first substrate 100. Accordingly, the optical waveguide 125 may include a semiconductor material such as silicon (Si), germanium (Ge), etc., e.g., single crystalline silicon.

The second cladding 130 may extend in the first direction DR1 from the first cladding 110 and may extend along the third direction DR3 to be between the optical waveguide 125 and the epitaxial pattern 120. Accordingly, the second cladding 130 may cover both sidewalls of the optical waveguide 125.

The second cladding 130 may include a material having a refractive index lower than silicon (Si), e.g., silicon oxide ($SiO_2$), silicon nitride (SiN), etc. Alternatively, the second cladding 130 may include air.

The first adhesive layer 140 may be conformally formed on the epitaxial pattern 120, the optical waveguide 125, and the second cladding 130. The first adhesive layer 140 may have a thickness much smaller than a thickness of other layer structures, e.g., the optical waveguide 125, the first cladding 110, the second cladding 130, etc. In one embodiment, the first adhesive layer 140 may have a small thickness of about 20 Å or less. The first adhesive layer 140 may include an oxide, e.g., silicon oxide, etc.

In example embodiments, the laser light source chip 350 may have a so-called separate confinement heterostructure (SCH) laser structure. Accordingly, the laser light source chip 350 may include a first SCH pattern 310, an active pattern 320, a second SCH pattern 330, and a third cladding 340 sequentially stacked along the first direction DR1.

Each of the first SCH pattern 310, the active pattern 320, the second SCH pattern 330, and the third cladding 340 may include III-V compounds. In example embodiments, the first and second SCH patterns 310 and 330 may include a material having a refractive index lower than that of the active pattern 320 and greater than that of the third cladding 340. Also, the first SCH pattern 310 may include a material doped with n-type impurities, and each of the second SCH pattern 330 and the third cladding may include a material doped with p-type impurities.

Accordingly, the first SCH pattern 310 may include, e.g., indium gallium aluminum arsenide (InGaAlAs) doped with n-type impurities, the active pattern 320 may include, e.g., undoped indium gallium aluminum arsenide (InGaAlAs), the second SCH pattern 330 may include, e.g., indium gallium aluminum arsenide (InGaAlAs) doped with p-type impurities, and the third cladding 340 may include, e.g., indium phosphide (InP) doped with p-type impurities.

In other embodiments, the laser light source chip 350 may have a double hetero junction laser, a quantum well laser, a quantum cascade laser, an interband cascade laser, a distributed Bragg reflector (DBR) laser, etc.

A third adhesive layer 370 may be conformally formed to cover a lower surface and sidewalls of the laser light source chip 350. Accordingly, the third adhesive layer 370 may be formed on the first adhesive layer 140 and may include a horizontal portion extending in the second direction DR2 and a vertical portion extending from the horizontal portion in a vertical direction substantially perpendicular to the upper surface of the first substrate 100, i.e., the first direction DR1. That is, the lower surface and the sidewall of the laser light source chip 350 may be covered by the horizontal portion and the vertical portion of the third adhesive layer 370, respectively.

The third adhesive layer 370 may protect the sidewall of the laser light source chip 350 to prevent damage during a process of separating a second substrate, which will be described later. Also, the third adhesive layer 370 may contact the first adhesive layer 140 on the first substrate 100 to increase the adhesive force between the first substrate 100 and the second substrate.

The third adhesive layer 370 may include an oxide, e.g., silicon oxide, etc., and, thus, may be merged with the first adhesive layer 140 to form an adhesive structure. In this case, the adhesive structure may be formed on the first substrate 100 to cover the epitaxial pattern 120 including upper surfaces coplanar with each other and upper surfaces of the optical waveguide 125 and the second cladding 130, and may cover the lower surface and the sidewalls of the laser light source chip 350.

The third adhesive layer 370 may have a thickness much smaller than a thickness of other layer structures, e.g., the optical waveguide 125, the first cladding 110, the second cladding 130, etc. In one embodiment, the third adhesive layer 370 may have a small thickness of about 20 Å or less.

The semiconductor laser device may further include first and second electrodes electrically connected to the first SCH pattern 310 and the third cladding 340, respectively, of the laser light source chip 350. Accordingly, a current may be generated in the laser light source chip 350 by applying voltages to the first and second electrodes, and by the current, electrons and holes may be combined to generate a laser beam in the active pattern 320 between the first SCM pattern 310 doped with n-type impurities and the second SCH pattern 330, and the third cladding 340 doped with p-type impurities.

The laser beam generated in the laser light source chip 350 may be incident on the optical waveguide 125 thereunder. The optical waveguide 125 may include a material having a refractive index higher than that of the second cladding 130 covering both sidewalls of the optical waveguide 125 or the first cladding 110 covering a lower surface of the of the optical waveguide 125, so that the generated laser beam may be guided by the optical waveguide 125 to move along the first direction DR1 along which the optical waveguide 125 extends.

Although the first and third adhesive layers 140 and 370 are between the optical waveguide 125 and the laser light source chip 350, since the sum of the thicknesses of the first and third adhesive layers 140 and 370 may be much smaller than a thickness of other layer structures, e.g., the optical waveguide 125, the first cladding 110, etc., the first and third adhesive layers 140 and 370 may not have a great influence on the movement of the laser beam generated by the laser light source chip 350 to the optical waveguide 125.

As described above, in the process of manufacturing the semiconductor laser device, the sidewall of the laser light source chip 350 may be prevented from being damaged due to the third adhesive layer 370 covering the sidewall of the laser light source chip 350. Also, in a process of bonding the first substrate 100 and the second substrate, due to the first adhesive layer 140 on the epitaxial pattern 120 and the optical waveguide 125 on the first substrate 100 and to the third adhesive layer 370 on the laser light source chip 350 on the second substrate, the first substrate 100 and the second substrate may be well bonded without a void therebetween. Accordingly, the semiconductor laser device may have improved characteristics.

FIGS. 2 to 6 are cross-sectional views illustrating stages in a method of manufacturing a semiconductor laser device in accordance with example embodiments.

Figure 2:
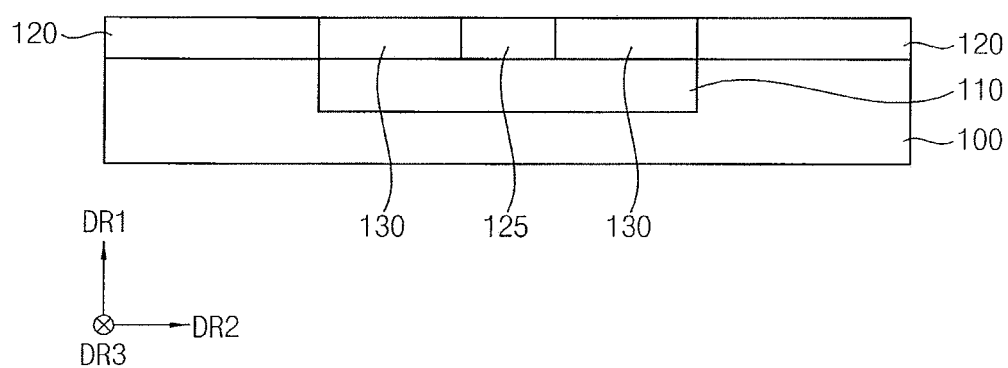
FIGS. 2 to 6 illustrate cross-sectional views of stages in a method of manufacturing a semiconductor laser device in accordance with example embodiments.

Referring to FIG. 2, the first cladding 110 may be formed at an upper portion of a first substrate 100, and an epitaxial pattern 120, an optical waveguide 125 and a second cladding 130 may be formed on the first substrate 100 and the first cladding 110.

The first substrate 100 may be a semiconductor substrate including, e.g., silicon (Si), germanium (Ge), etc. In one embodiment, the first substrate 100 may be a single crystalline silicon substrate. The first substrate 100 may be doped, e.g., with p-type or n-type impurities.

The first cladding 110 may be formed by partially removing an upper portion of the first substrate 100 to form a trench, forming a first cladding layer on the first substrate 100 to fill the trench, and planarizing the first cladding layer until an upper surface of the first substrate 100 may be exposed. The first cladding 110 may include a material having a refractive index lower than silicon (Si), e.g., silicon oxide ($SiO_2$), silicon nitride (SiN), etc. The planarization process may include, e.g., a chemical mechanical polishing (CMP) process, an etch back process, etc.

In example embodiments, the epitaxial pattern 120 and the optical waveguide 125 may be formed by a solid phase epitaxy (SPE) process using the upper surface of the first substrate 100 as a seed and an etching process. Specifically, an amorphous layer, e.g., including silicon, etc., may be formed on the first substrate 100 and the first cladding 110, and a heat treatment may be performed on the amorphous layer to form an epitaxial layer having the same crystallinity as the first substrate 100, e.g., having single crystalline and including silicon. An etch mask may be provided on the epitaxial layer and the epitaxial layer may be patterned by an etching process using the etching mask to form the epitaxial pattern 120 and the optical waveguide 125.

In example embodiments, each of the epitaxial pattern 120 and the optical waveguide 125 may extend in the second direction DR3. That is, the optical waveguide 125 may have a bar shape extending in the second direction DR3. The epitaxial pattern 120 may be formed on the first substrate 100 and the optical waveguide 125 may be formed on the first cladding 110.

The epitaxial layer may be patterned to form an opening exposing an upper surface of the first cladding 110 between the epitaxial pattern 120 and the optical waveguide 125, and the second cladding 130 may be formed to fill the opening.

The second cladding 130 may be formed by forming a second cladding layer on the first cladding 110, the epitaxial pattern 120, and the optical waveguide 125, and planarizing the second cladding layer until upper surfaces of the epitaxial pattern 120 and the upper surface of the optical waveguide 125 are exposed. Accordingly, the second cladding 130 may cover both sidewalls of the optical waveguide 125 in the first direction.

The second cladding 130 may include a material having a refractive index lower than silicon (Si), e.g., silicon oxide ($SiO_2$), silicon nitride (SiN), etc. Alternatively, the second cladding 130 may include air, and in this case, the process of forming the second cladding layer to fill the opening may be omitted.

Figure 3:
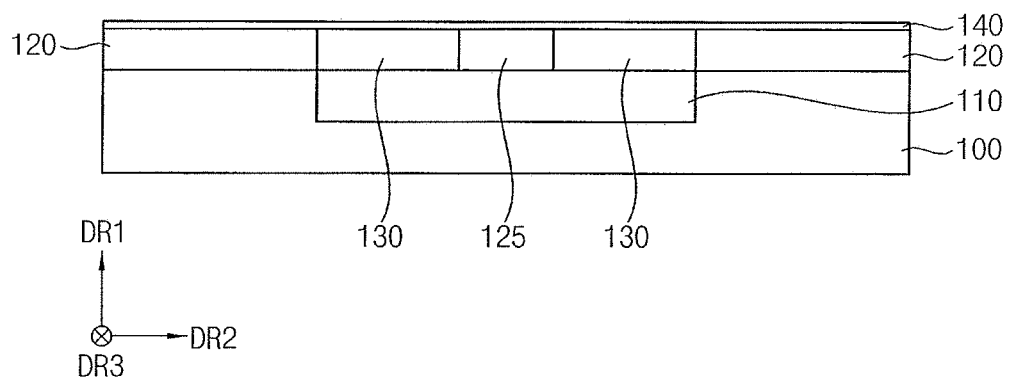

Referring to FIG. 3, a first adhesive layer 140 may be formed on the epitaxial pattern 120, the optical waveguide 125 and the second cladding 130. In example embodiments, the first adhesive layer 140 may be formed by an atomic layer deposition (ALD) process, and may include, e.g., silicon oxide. The first adhesive layer 140 may have a thickness much smaller than a thickness of other layer structures, e.g., a thickness of about 20 Å or less.

Figure 4:
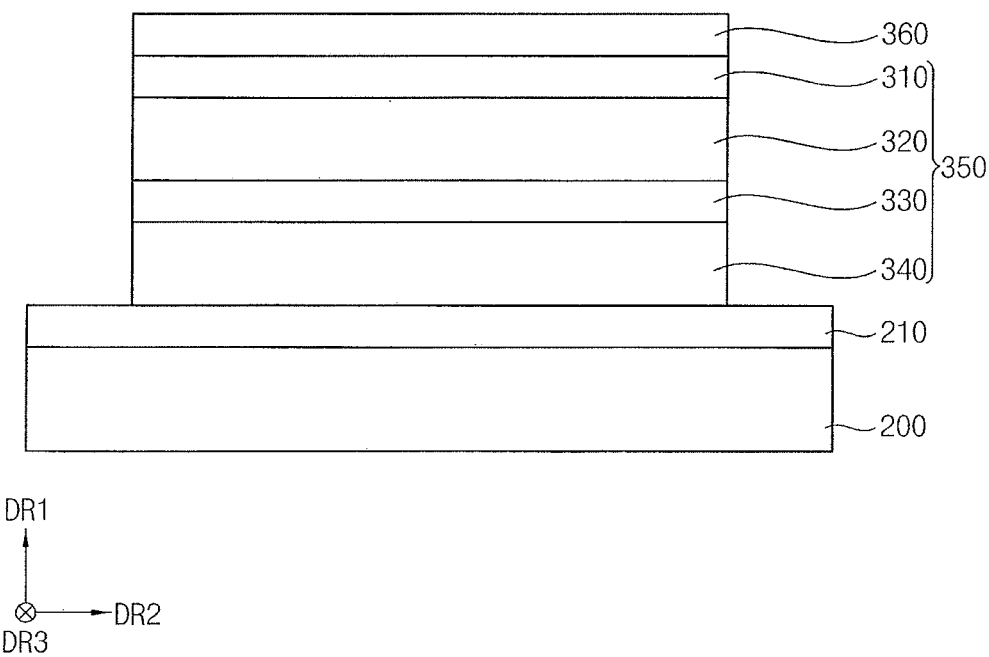

Referring to FIG. 4, a second adhesive layer 210 may be formed on a second substrate 200, and a laser light source chip 350 and a protective layer 360 sequentially stacked may be formed on the second adhesive layer 210.

The second substrate 200 may be a handling substrate, and may include a semiconductor material, e.g., silicon, etc., or an insulating material, e.g., glass, etc.

The second adhesive layer 210 may be formed to increase the adhesive force between the second substrate 200 and the laser light source chip 350. The second adhesive layer 210 may include, e.g., a photoresist layer.

In one embodiment, the laser light source chip 350 may include the third cladding 340, the second SCH pattern 330, the active pattern 320, and the first SCH pattern 310 sequentially stacked along the first direction DR1. Each of the third cladding 340, the second SCH pattern 330, the active pattern 320, and the first SCH pattern 310 may include III-V compounds.

In example embodiments, the first and second SCH patterns 310 and 330 may have a material having a refractive index lower than that of the active pattern 320 and higher than that of the third cladding 340. Also, the first SCH pattern 310 include a material doped with n-type impurities, and each of the third cladding 340 and the second SCH pattern 330 may include a material doped with p-type impurities. Accordingly, the third cladding 340 may include, e.g., indium phosphide (InP) doped with p-type impurities, the second SCH pattern 330 may include, e.g., indium gallium aluminum arsenide (InGaAlAs) doped with p-type impurities, the active pattern 320 may include, e.g., undoped indium gallium aluminum arsenide (InGaAlAs), and the first SCH pattern 310 may include, e.g., indium gallium aluminum arsenide (InGaAlAs) doped with n-type impurities.

The protective layer 360 may include, e.g., a photoresist layer. The laser light source chip 350 and the protective layer 360 may be bonded to the second substrate 200 having the second adhesive layer 210, such that the laser light source chip 350 and the second substrate 200 may be well bonded.

Figure 5:
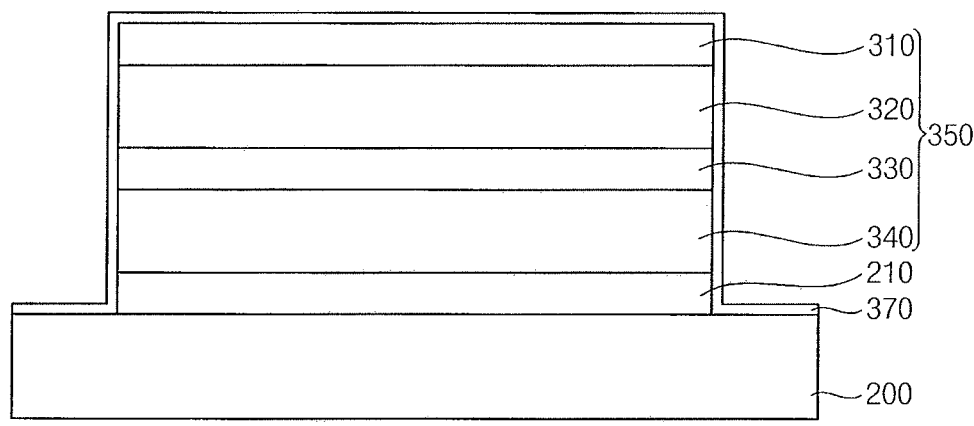

Referring to FIG. 5, the protective layer 360 and a portion of the second adhesive layer 210 not covered by the laser light source chip 350 may be removed. Thus, the laser light source chip 350 and a portion of an upper surface of the second substrate 200 may be exposed. In example embodiments, the protective layer 360 and the portion of the second adhesive layer 210 may be removed by performing exposure and development processes.

The third adhesive layer 370 may be formed on an upper surface and a sidewall of the exposed laser light source chip 350 and the exposed portion of the upper surface of the second substrate 200. In example embodiments, the third adhesive layer may be formed by an ALD process, and may include, e.g., silicon oxide. Similarly to the first adhesive layer 140, the third adhesive layer 370 may also have a thickness much smaller than a thickness of other layer structures, e.g., a thickness of 20 Å or less.

Figure 6:
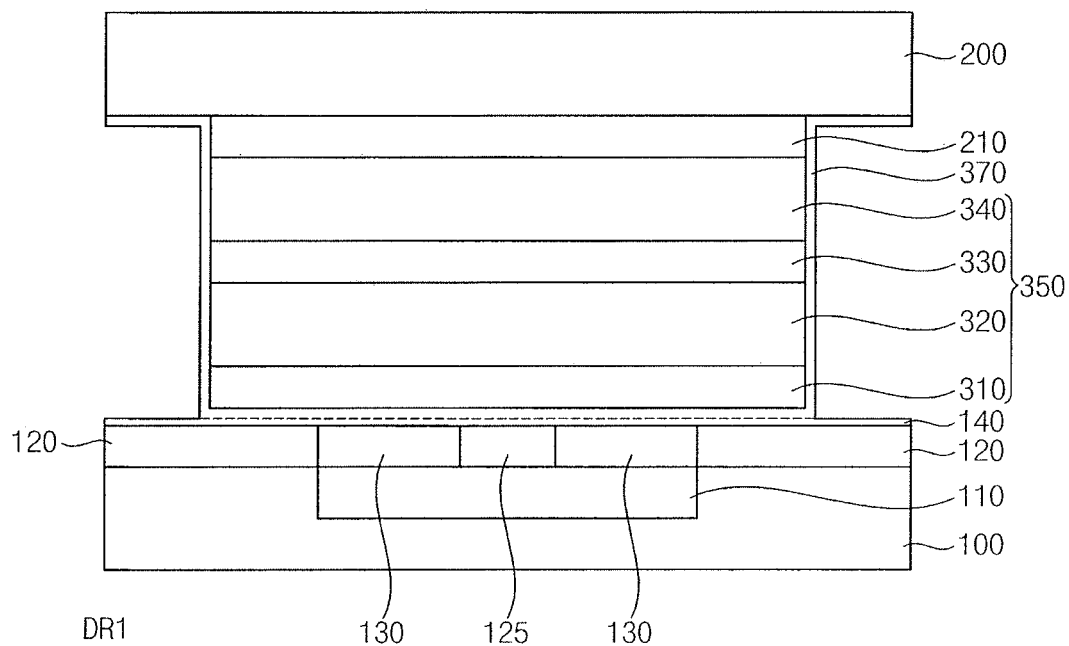

Referring to FIG. 6, after flipping the second substrate 200 by 180 degrees, the second substrate 200 and the first substrate 100 may be bonded to each other such that the upper surface of the laser light source chip 350 may face the upper surface of the first substrate 100 on which the epitaxial pattern 120, the optical waveguide 125 and the second cladding 130 may be formed.

When the first and second substrates 100 and 200 are bonded, the first and third adhesive layers 140 and 370 may contact each other. The first and third adhesive layers 140 and 370 may include the same material, e.g., silicon oxide, so as to be well bonded to each other.

In example embodiments, before the first and second substrates 100 and 200 are bonded, a plasma treatment using, e.g., oxygen, nitrogen, argon, etc., may be performed on each of first and second substrates 100 and 200, to improve the adhesion of the first and third adhesive layers 140 and 370. Accordingly, no void may be formed between the laser light source chip 350 and the epitaxial pattern 120 or between the laser light source chip 350 and the optical waveguide 125.

Referring to FIG. 1 again, the second substrate 200 may be separated from the laser light source chip 350 and the exposed second adhesive layer 210 may be removed to complete the fabrication of the semiconductor laser device.

Accordingly, the laser light source chip 350 may be stacked on the optical waveguide 125 on the first substrate 100, the sidewall of the laser light source chip 350 may be covered by the third adhesive layer 370, and the first and third adhesive layers 140 and 370 may be interposed between the laser light source chip 350 and the epitaxial pattern 120, the optical waveguide 125, and the second cladding 130.

The separation of the second substrate 200 and the removal of the second adhesive layer 210 may be performed by a wet etching process using, e.g., an hydrochloric acid (HCl), and the sidewall of the laser light source chip 350 may be covered and protected by the third adhesive layer 370, to prevent damage thereto during the wet etching process.

As described above, when the first substrate 100, having the epitaxial pattern 120 and the optical waveguide 125, and the second substrate 200, having the laser light source chip 350, are bonded to each other, the first and second substrates 100 and 200 may be well bonded without a void by the first and third adhesive layers 140 and 370 therebetween. Also, the sidewall of the laser light source chip 350 may be covered by the third adhesive layer 370. Thus, the laser light source chip 350 may not be damaged by the separation process, e.g., a wet etch, that may be performed to separate the second substrate 200 from the first substrate 100.

Figure 7:
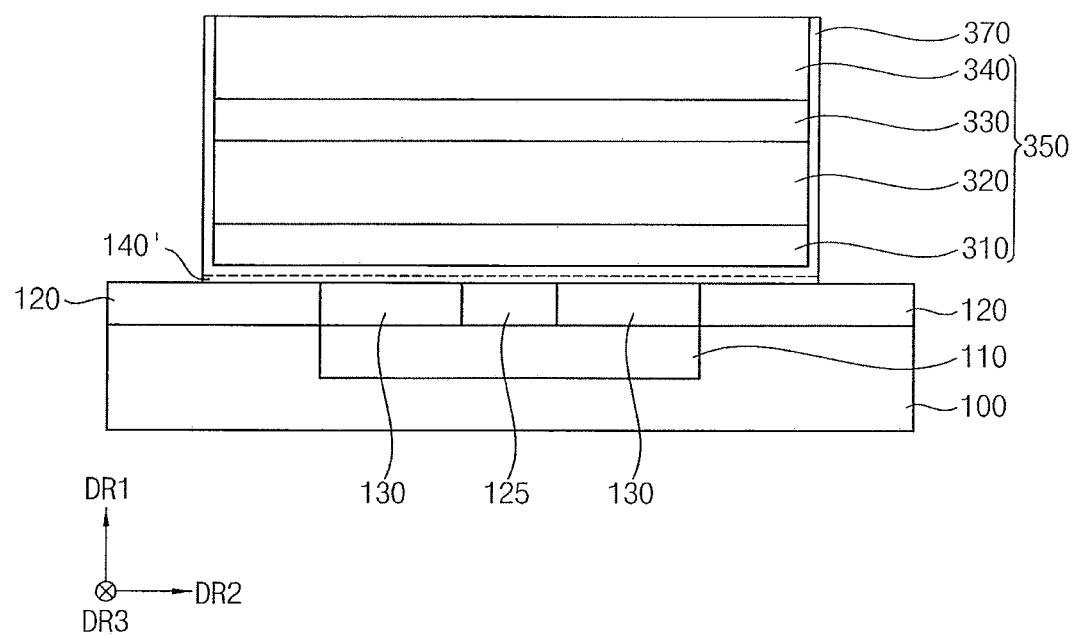
FIG. 7 illustrates a cross-sectional view of a semiconductor laser device in accordance with example embodiments.

FIG. 7 is a cross-sectional view illustrating a semiconductor laser device in accordance with example embodiments. This semiconductor laser device is substantially the same as or similar to the semiconductor device described in FIG. 1, except for the first adhesive layer. Accordingly, like reference numerals refer to like elements, and detailed descriptions thereon are omitted herein.

Referring to FIG. 7, a first adhesive layer 140' may not be on a portion of the epitaxial pattern 120 not contacting, e.g., overlapping along the first direction DR1, the laser light source chip 350. Since the first adhesive layer 140' is to increase the adhesive force between the epitaxial pattern 120 and the optical waveguide 125 on the first substrate 100 and the laser light source chip 350 on the second substrate 200 when the first and second substrates 100 and 200 are bonded to each other, there is no need for the first adhesive layer 140' on the portion of the epitaxial pattern 120 that does not overlap the laser light source chip 350.

As described above, example embodiments provide a semiconductor laser device having improved characteristics. In particular, a semiconductor laser device in accordance with example embodiments may protect a sidewall of a laser light source chip using an adhesive layer to prevent damage to the laser light source chip. Also, when the semiconductor laser device is fabricated by bonding a first substrate on which an optical waveguide and an epitaxial pattern are formed and a second substrate on which the laser light source chip is formed, the optical waveguide and the epitaxial pattern and the laser light source chip may be bonded well without a void by the adhesive layer. Accordingly, the semiconductor laser device may have improved characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor laser device, comprising:
   a first cladding on a substrate;
   an optical waveguide on the first cladding;
   a laser light source chip on the optical waveguide;
   a first adhesive layer between the optical waveguide and the laser light source chip; and
   a second adhesive layer covering a sidewall and a lower surface of the laser light source chip, the second adhesive layer directly contacting the lower surface of the laser light source chip.

2. The semiconductor laser device as claimed in claim 1, wherein the second adhesive layer directly contacts the first adhesive layer.

3. The semiconductor laser device as claimed in claim 2, wherein a sum of thicknesses of the first and second adhesive layers between the laser light source chip and the optical waveguide is smaller than a thickness of either of the laser light source chip and the first cladding.

4. The semiconductor laser device as claimed in claim 1, further comprising:
   an epitaxial pattern on the substrate and spaced apart from the optical waveguide;
   a second cladding on the first cladding, the second cladding between the optical waveguide and the epitaxial pattern and covering the sidewall of the optical waveguide.

5. The semiconductor laser device as claimed in claim 4, wherein upper surfaces of the epitaxial pattern, the optical waveguide, and the second cladding are substantially coplanar.

6. The semiconductor laser device as claimed in claim 4, wherein the first adhesive layer covers upper surfaces of the optical waveguide, the second cladding, and the epitaxial pattern.

7. The semiconductor laser device as claimed in claim 6, wherein:
   the laser light source chip partially overlaps the epitaxial pattern in a vertical direction substantially perpendicular to an upper surface of the substrate, and
   the first adhesive layer is not on a portion of the upper surface exposed by the laser light source chip.

8. The semiconductor laser device as claimed in claim 4, wherein the second cladding includes silicon oxide, silicon nitride, or air.

9. The semiconductor laser device as claimed in claim 1, wherein each of the first and second adhesive layers includes an oxide.

10. The semiconductor laser device as claimed in claim 1, wherein the first cladding includes silicon oxide or silicon nitride.

11. The semiconductor laser device as claimed in claim 1, wherein the laser light source chip includes a first SCH pattern, an active pattern, a second SCH pattern, and a third cladding sequentially stacked.

12. The semiconductor laser device as claimed in claim 11, wherein:

the first separate confinement heterostructure pattern, the active pattern, and the second separate confinement heterostructure pattern include indium gallium aluminum arsenide, and the first and second separate confinement heterostructure patterns are doped with n-type impurities and p-type impurities, respectively.

13. The semiconductor laser device as claimed in claim 11, wherein the third cladding includes indium phosphide (InP) doped with p-type impurities.

14. A semiconductor laser device, comprising:
a laser light source chip;
an optical waveguide under the laser light source chip;
a substrate on which the optical waveguide is formed;
an epitaxial pattern on the substrate; and
an adhesive layer structure between the laser light source chip and the epitaxial pattern, the adhesive layer structure covering a sidewall and a lower surface of the laser light source chip, and directly contacting the lower surface of the laser light source chip.

15. The semiconductor laser device as claimed in claim 14, further comprising:
a first cladding on the substrate, the first cladding covering a lower portion of the optical waveguide; and
a second cladding on the first cladding, the second cladding covering a sidewall of the optical waveguide,
wherein the adhesive layer structure covers upper surfaces of the epitaxial pattern, the optical waveguide and the second cladding.

16. The semiconductor laser device as claimed in claim 15, wherein the epitaxial pattern and the optical waveguide include the same material.

17. The semiconductor laser device as claimed in claim 14, wherein:
the adhesive layer structure includes first and second adhesive layers, the first adhesive layer being between the laser light source chip and the epitaxial pattern, and the second adhesive layer covering the sidewall of the laser light source chip, and wherein each of the first and second adhesive layers includes an oxide.

18. A semiconductor laser device, comprising:
a first cladding on a substrate;
an optical waveguide on the first cladding;
an epitaxial pattern on the substrate, the epitaxial pattern including the same material as the optical waveguide and spaced apart from the optical waveguide;
a second cladding on the first cladding, the second cladding being between the optical waveguide and the epitaxial pattern;
a first adhesive layer covering upper surfaces of the epitaxial pattern, the optical waveguide, and the second cladding;
a second adhesive layer including:
a horizontal portion on the first adhesive layer, the horizontal portion extending in a horizontal direction substantially parallel to an upper surface of the substrate; and
a vertical portion extending from the horizontal portion in a vertical direction substantially perpendicular to the upper surface of the substrate from the horizontal portion; and
a laser light source chip having a lower surface and a sidewall covered by the second adhesive layer,
wherein the horizontal portion of the second adhesive layer directly contacts the lower surface of the laser light source chip.

19. The semiconductor laser device as claimed in claim 18, wherein upper surfaces of the epitaxial pattern, the optical waveguide, and the second cladding are coplanar.

20. The semiconductor laser device as claimed in claim 18, wherein:
the laser light source chip partially overlaps the epitaxial pattern in a vertical direction substantially perpendicular to the upper surface of the substrate, and
the first adhesive layer is not the upper surface of the epitaxial pattern exposed by the laser light source chip.

* * * * *